(12) United States Patent
Hwang et al.

(10) Patent No.: US 6,455,403 B1
(45) Date of Patent: Sep. 24, 2002

(54) SHALLOW TRENCH CONTACT STRUCTURE TO SOLVE THE PROBLEM OF SCHOTTKY DIODE LEAKAGE

(75) Inventors: Jei-Fung Hwang, Hsin-Chu (TW); Ruey-Hsing Liou, Miao-Li (TW); Chih-Kang Chiu, Yung-Ho (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/225,377

(22) Filed: Jan. 4, 1999

(51) Int. Cl.⁷ .......................... H01L 21/28; H01L 21/44
(52) U.S. Cl. ................. 438/576; 438/570; 438/571; 438/573; 438/582; 438/583
(58) Field of Search .................. 438/570, 571, 438/572, 573, 576, 578, 582, 583, 422, 579, FOR 177, 580, 581; 257/73, 280, 283

(56) References Cited

U.S. PATENT DOCUMENTS

| | | | | |
|---|---|---|---|---|
| 3,906,540 A | * | 9/1975 | Hollins | 257/476 |
| 4,619,035 A | * | 10/1986 | Hotta et al. | 438/581 |
| 4,800,171 A | * | 1/1989 | Iranmanesh et al. | 438/207 |
| 4,835,580 A | | 5/1989 | Havemann et al. | 257/478 |
| 5,166,094 A | | 11/1992 | Kapoor | 438/328 |
| 5,438,218 A | * | 8/1995 | Nakamura et al. | 257/452 |
| 5,583,348 A | | 12/1996 | Sundaram | 257/73 |
| 5,672,898 A | * | 9/1997 | Keller et al. | 257/383 |
| 5,925,902 A | * | 7/1999 | Sakura | 257/280 |
| 5,994,753 A | * | 11/1999 | Nitta | 257/471 |
| 6,096,629 A | * | 8/2000 | Tsai et al. | 438/570 |

* cited by examiner

Primary Examiner—Carl Whitehead, Jr.
Assistant Examiner—Maria Guerrero
(74) Attorney, Agent, or Firm—George O. Saile; Stephen B. Ackerman; Rosemary L. S. Pike

(57) ABSTRACT

A method for fabricating a Schottky diode using a shallow trench contact to reduce leakage current in the fabrication of an integrated circuit device is described. The method provides a simple and effective method for decreasing the possibility of forming a bad Schottky diode.

18 Claims, 5 Drawing Sheets

SHALLOW TRENCH CONTACT STRUCTURE TO SOLVE THE PROBLEM OF SCHOTTKY DIODE LEAKAGE

BACKGROUND OF THE INVENTION (1) Field of the Invention

The invention relates to the fabrication of integrated circuit devices, and more particularly, to a method of fabricating a Schottky diode using a shallow trench structure to solve the leakage current problem in the fabrication of integrated circuits.

(2) Description of the Prior Art

The contact structure of a metal to a lightly doped silicon is known as a Schottky diode. Typically, Aluminum is the metal used. The aluminum material's directly touching the silicon substrate within the contact hole often causes junction spiking. A barrier metal layer such as titanium tungsten, titanium nitride, or the like has been added between the silicide and the aluminum material to reduce junction spiking. A platinum silicide (PtSi) layer, for example, is formed between the Al and the barrier metal and the silicon substrate. The traditional contact structure requires a small amount of silicon loss in the silicide formation. However, this will increase the sensitivity of the Schottky diode to leakage caused by the metal pre-sputter etch. It is desired to find a method of making a Schottky diode structure without concern of junction leakage.

U.S. Pat. No. 4,835,580 to Havemann et al teaches a method of embedding a Schottky barrier diode within a bipolar transistor. They use a deep trench to increase diode area and decrease diode series and base-collector capacitance. U.S. Pat. No. 5,583,348 to Sundaram shows a method for forming a Schottky diode within a contact opening where a platinum silicide layer is deposited at the bottom of the opening. U.S. Pat. No. 5,166,094 to Kapoor teaches a method of forming Schottky diodes in base coupled transistor logic.

SUMMARY OF THE INVENTION

A principal object of the present invention is to provide an effective and very manufacturable method of fabricating a Schottky diode with reduced leakage current in the fabrication of an integrated circuit device.

Another object of the present invention is to provide an effective and very manufacturable method of fabricating a Schottky diode using a shallow trench contact to reduce leakage current in the fabrication of an integrated circuit device.

A further object of the invention is to provide a method of fabricating a Schottky diode using a shallow trench contact which leads to better silicide coverage of the contact opening thereby reducing junction leakage.

A still further object of the invention is to provide a method of fabricating a Schottky diode using a shallow trench contact obtained by an overetch of the traditional contact etch which leads to better silicide coverage of the contact opening thereby reducing junction leakage.

In accordance with the objects of this invention a method for fabricating a Schottky diode using a shallow trench contact to reduce leakage current in the fabrication of an integrated circuit device is achieved. A thermal oxide layer is provided overlying a silicon semiconductor substrate. An insulating layer is deposited overlying the thermal oxide layer. A contact opening is etched through the insulating layer and the thermal oxide layer to the silicon substrate. The contact opening is overetched whereby a shallow trench is formed within the silicon substrate underlying the contact opening wherein the shallow trench has a bottom and sidewalls comprising the silicon substrate. A first metal layer is deposited over the insulating layer and within the contact opening and within the shallow trench. The first metal layer is sintered whereby the first metal layer is transformed to a silicide layer where the silicide layer contacts the silicon substrate at the bottom and sidewalls of the shallow trench and wherein the first metal layer contacting the insulating layer and thermal oxide layer is not transformed. The untransformed first metal layer is removed. A barrier metal layer is deposited overlying the insulating layer and the silicide layer within the shallow trench. A second metal layer is deposited overlying the barrier metal layer to complete fabrication of a Schottky diode in an integrated circuit device.

Also in accordance with the objects of this invention, an improved Schottky diode in an integrated circuit device is described. A metal layer extends through an opening in an insulating layer contacting a silicon semiconductor substrate. A barrier metal layer underlies the metal layer within the opening. A metal silicide region within a shallow trench contacts the silicon semiconductor substrate at the bottom and sidewalls of the shallow trench underlying the barrier metal layer within the contact opening.

BRIEF DESCRIPTION OF THE DRAWINGS

In the accompanying drawings forming a material part of this description, there is shown.

DESCRIPTION OF THE PREFERRED EMBODIMENTS

Figure 1:
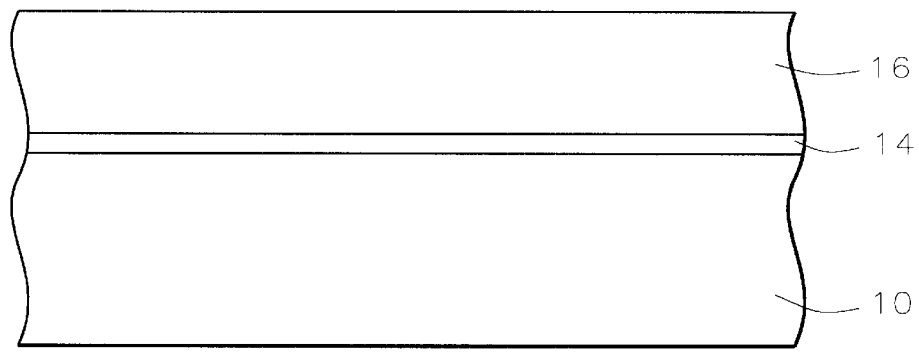
FIGS. 1 through 9 schematically illustrate in cross-sectional representation a preferred embodiment of the present invention.

The process of the present invention provides a method for fabricating a Schottky diode with reduced junction leakage. This is achieved by forming the Schottky diode within a shallow trench contact. The shallow trench contact can be used in the traditional CMOS or BiCMOS process. CMOS and BiCMOS semiconductor devices are not shown in the drawing figures. It will be understood by those skilled in the art that the process of the invention can be incorporated into either a CMOS or BiCMOS process.

Referring now more particularly to FIG. 1, there is shown an illustration of a portion of a partially completed integrated circuit. The semiconductor substrate 10 is preferably composed of silicon having a (100) crystallographic orientation. Isolation between active and inactive regions, not shown, may be formed as is conventional in the art. The surface of the silicon substrate 10 is thermally oxidized to form an oxide layer 14 having a thickness of between about 300 and 400 Angstroms. Next, a dielectric layer 16, comprising borophosphosilicate glass (BPSG) or borophosphotetraethoxysilane (BP-TEOS), or the like, is deposited over the thermal oxide layer 14 to a thickness of between about 8500 and 9000 Angstroms.

Figure 2:
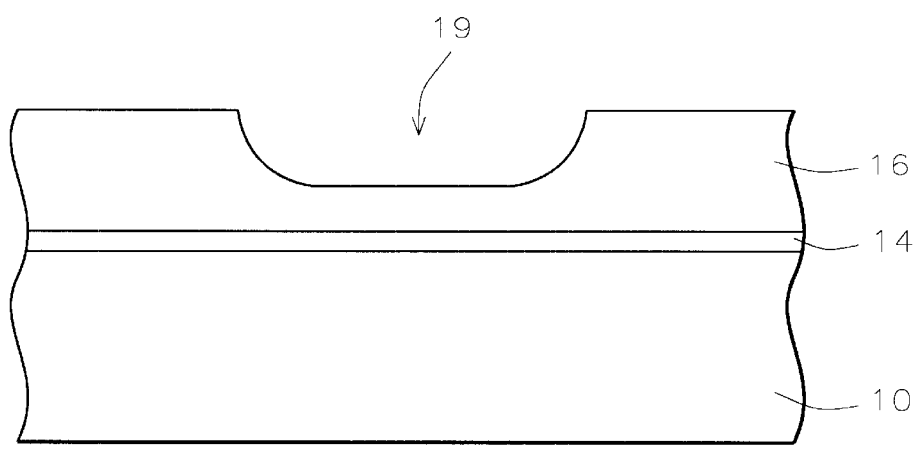

The contact opening is defined using conventional photolithography methods, not shown. The BPSG and oxide layers 16 and 14 are etched using a conventional wet etching recipe to form contact opening 19, illustrated in FIG. 2. After the wet etch, about 4000 to 5000 Angstroms of BPSG 16 remains.

Figure 3:
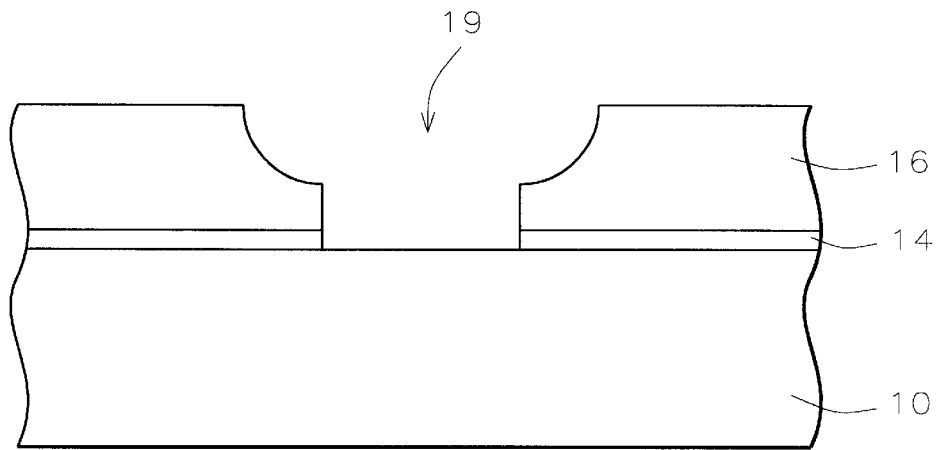

Next, a dry etch is used to etch away the remaining oxide within the contact opening 19, as shown in FIG. 3.

Figure 4:
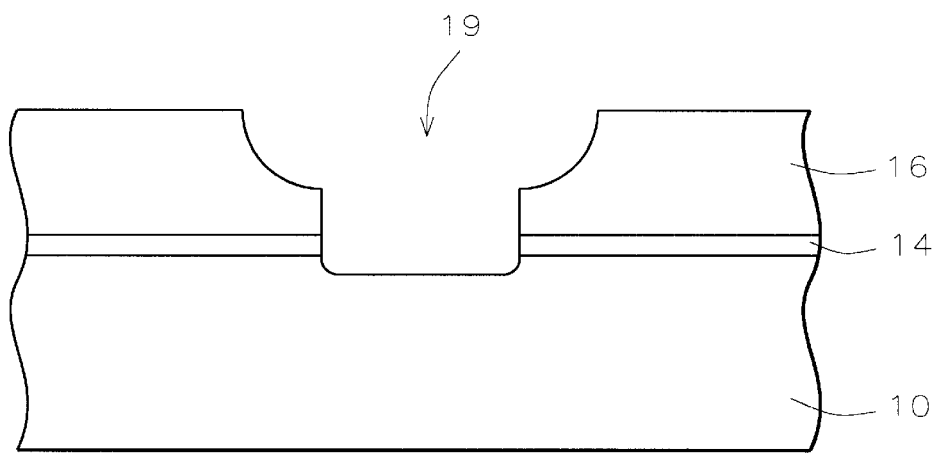

The key feature of the present invention is a further etching of the contact opening to form a shallow trench. After the endpoint signal is caught, upon exposure of the silicon substrate, the dry etch is continued in an overetch for between about 45 and 50 seconds to form a shallow trench within the silicon substrate, as shown in FIG. 4. The shallow trench penetrates the silicon substrate by between about 300 and 500 Angstroms.

Figure 5:
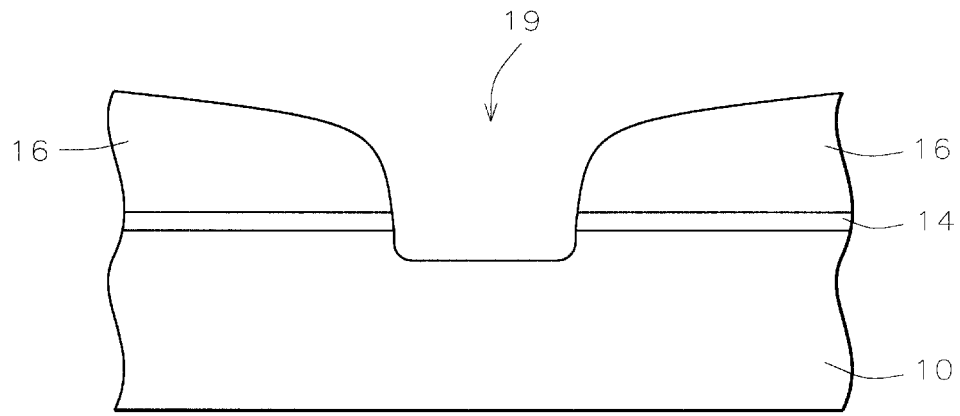

Referring now to FIG. 5, the BPSG layer 16 is reflowed. This will result in curved sidewalls of the contact opening 19. The curved contact opening will improve the step coverage of the barrier metal and metal sputtering steps.

A thin native oxide layer of about 100 Angstroms in thickness will form on the surfaces of the contact opening as a result of the thermal reflow process. This native oxide is removed prior to further processing.

Figure 6:
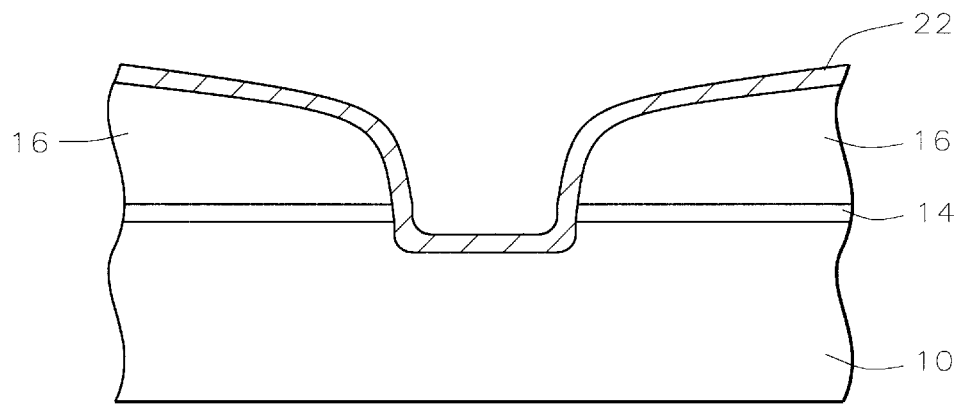

Referring now to FIG. 6, a layer of metal such as platinum or molybdenum 22 is sputter deposited over the BPSG layer and within the shallow trench to a thickness of between about 400 and 500 Angstroms.

Figure 7:
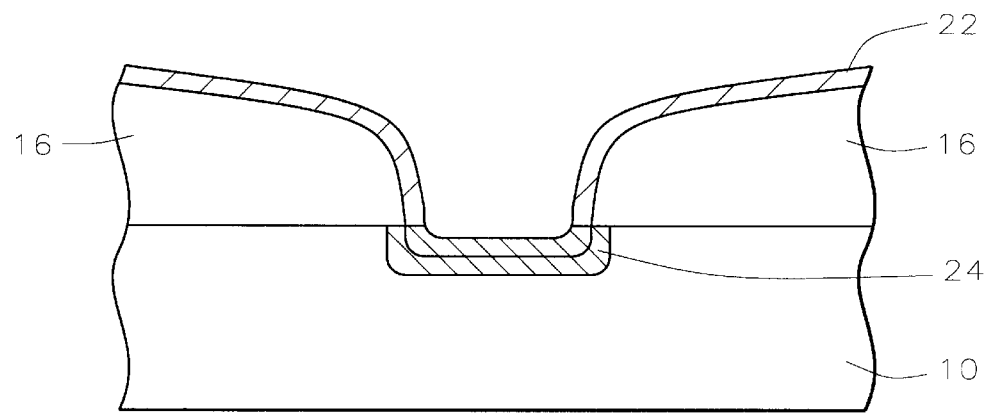

Referring now to FIG. 7, the platinum layer 22 over the silicon surface is transformed to platinum silicide 24 by a conventional sintering or annealing process. The platinum in contact with the silicon substrate at the bottom and sidewalls of the shallow trench will form platinum silicide, $PtSi_x$ 24. The shallow trench contact of the present invention makes a better bottom corner of the contact hole leading to better full silicide coverage of the contact hole. This in turn leads to a lower possibility of Schottky diode leakage and higher reverse-bias breakdown voltage.

Figure 8:
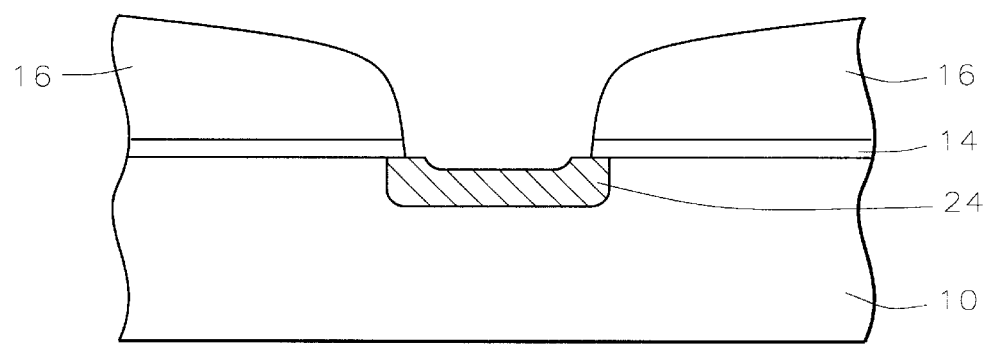

The remaining unreacted platinum 22 can be etched away using, for example, aqua regia for 4 minutes. The resulting structure is illustrated in FIG. 8. A pre-sputter etch is performed to clean the contact surface of any native oxide. Generally, this step will etch the oxide to a thickness of between about 50 and 100 Angstroms. This oxide loss increases the difficulty of completely covering the contact hole with the platinum silicide layer. However, the shallow trench of the invention increases the platinum silicide coverage thereby decreasing the sensitivity of the diode leakage to the pre-sputter etch.

Figure 9:
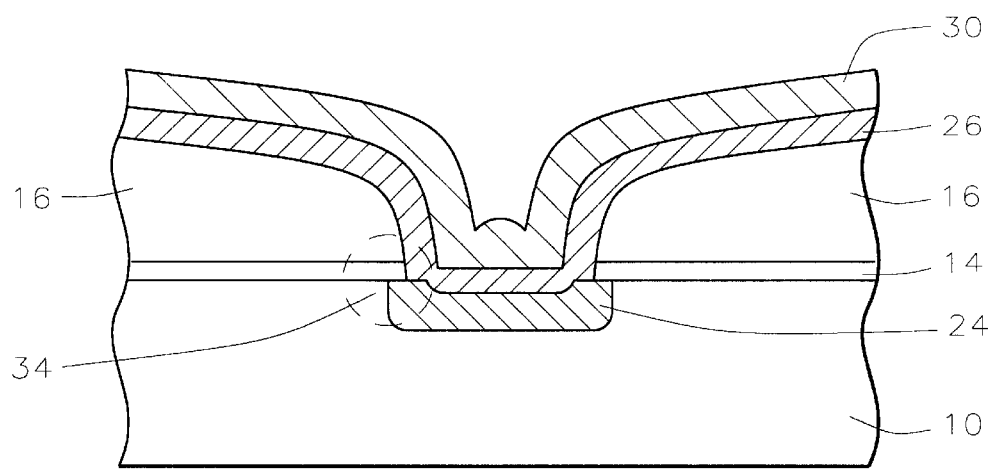

Referring now to FIG. 9, a barrier metal layer 26 is deposited over the BPSG layer and within the contact opening. The barrier metal layer may comprise titanium nitride, titanium tungsten, or a combination of titanium and titanium tungsten or titanium nitride and is deposited to a thickness of between about 1200 and 1600 Angstroms. Next, a metal layer 30 is sputter deposited over the barrier metal layer 26. Typically, the metal layer 30 is aluminum or an aluminum alloy, such as AlCu or AlSiCu, deposited to a thickness of between about 4000 and 6000 Angstroms.

The process of the invention provides an effective method of fabricating an integrated circuit device having a Schottky diode without the problem of leakage current. The shallow trench of the invention allows for a better coverage of the bottom corner 34 of the contact opening, thus preventing junction leakage.

Figure 10:
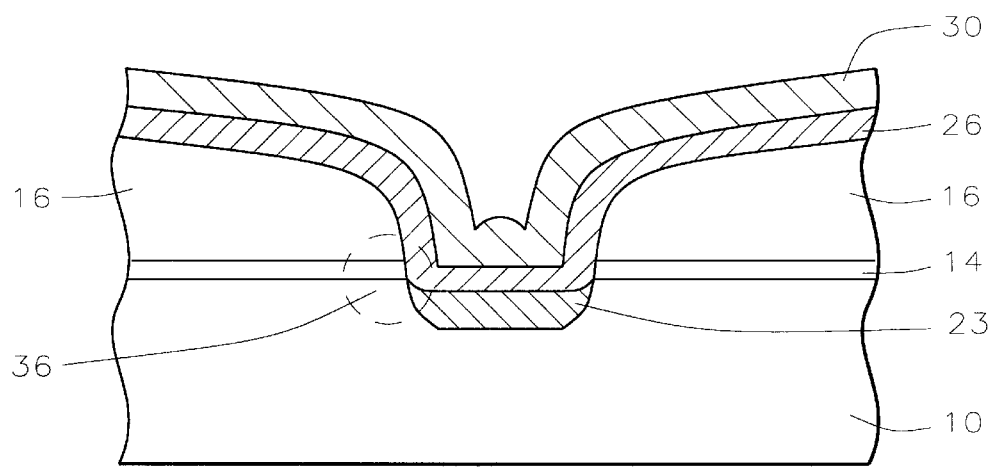
FIG. 10 illustrates in cross-sectional representation a Schottky diode of the prior art.

FIG. 10 shows a simplified form of a Schottky diode over which the present invention is an improvement. It is to be understood in this regard that no portion of FIG. 10 is admitted to be prior art as to the present invention. Rather, this diagram is provided in an effort to provide an improved understanding of the problems which are overcome by the invention. FIG. 10 illustrates a Schottky diode in which the silicide region 23 has been formed at the surface of the silicon substrate. Corner area 36 illustrates the source of possible Schottky diode leakage at the metal to silicon substrate interface because of the very thin silicide layer formed at the corner. In contrast, in the process of the present invention, the shallow trench allows for much better corner coverage by the silicide 24, shown in FIG. 9, especially at corner region 34. The thicker silicide 24 at the corner region 34 isolates the metal from the silicon substrate much better than in the prior art.

The process of the present invention has been tried experimentally and has been proven to result in much better Schottky diode performance as evidenced by much reduced leakage current and high reverse-bias breakdown voltage. The process of the invention is very easy to perform, requiring only an increase in the overetch time of the traditional contact dry etch recipe in order to provide a shallow trench contact within the silicon substrate. The shallow trench contact process of the present invention can be used widely in any process including the traditional CMOS and BiCMOS processes. The present invention decreases the possibility of forming a bad Schottky diode using the procedures of typical Schottky diode formation. For this purpose, the invention is very simple and effective.

The improved Schottky diode in an integrated circuit device of the present invention will be described with reference to FIG. 9. The Schottky diode comprises a metal layer 30 contacting the silicon substrate 10. Barrier metal layer 26 is interposed between the metal layer and the substrate. A silicide region 24 is formed within a shallow trench in the silicon substrate underlying the barrier metal layer. The silicide especially at the corner region 34 prevents leakage from the metal layer 30 through the barrier metal layer 26 into the silicon substrate 10.

The Schottky diode of the present invention has greatly reduced leakage current increased reverse-bias breakdown voltage over previous diodes because of the formation of the silicide layer within the shallow trench. The shallow trench allows for better full silicide coverage of the contact opening, especially at the bottom corners, so that there is a much reduced possibility of leakage current.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a Schottky diode in an integrated circuit device comprising:

providing a thermal oxide layer overlying a silicon substrate;

depositing an insulating layer overlying said thermal oxide layer;

etching a contact opening through said insulating layer and said thermal oxide layer to said silicon substrate;

overetching said contact opening for between 45 and 50 seconds after an endpoint etching signal is received whereby a shallow trench is formed within said silicon substrate underlying said contact opening wherein said shallow trench has a bottom and sidewalls comprising said silicon substrate and wherein said shallow trench has a depth of between 300 and 500 Angstroms into said silicon substrate;

thereafter reflowing said insulating layer thereby forming curved sidewalls of said contact opening;

depositing a first metal layer over said insulating layer and within said contact opening and within said shallow trench;

sintering said first metal layer whereby said first metal layer is transformed to a silicide layer where said silicide layer contacts said silicon substrate at said bottom and said sidewalls of said shallow trench and wherein said first metal layer contacting said insulating layer and said thermal oxide layer is not transformed;

removing said first metal layer that is not transformed to a silicide layer;

thereafter removing native oxide on said silicide layer whereby a portion of said thermal oxide layer is removed and wherein contact is not broken between said thermal oxide layer and said silicide layer at said sidewalls of said trench thereby preventing leakage;

thereafter depositing a barrier metal layer overlying said insulating layer and said silicide layer within said shallow trench wherein said barrier metal layer contacts said silicide layer at bottom and sidewall surfaces of said shallow trench; and depositing a second metal layer overlying said barrier metal layer to complete fabrication of said Schottky diode in said integrated circuit device.

2. The method according to claim 1 wherein said thermal oxide layer has a thickness of between about 300 and 400 Angstroms.

3. The method according to claim 1 wherein said insulating layer comprises borophosphosilicate glass having a thickness of between about 8500 and 9000 Angstroms.

4. The method according to claim 1 wherein said insulating layer comprises borophospho-tetraethoxysilane oxide having a thickness of between about 8500 and 9000 Angstroms.

5. The method according to claim 1 wherein said step of etching said contact opening comprises a first wet etch to etch between about 4000 and 5000 Angstroms of thickness of said insulating layer followed by a second dry etch to etch the remaining said insulating layer and said thermal oxide layer until said silicon substrate is exposed within said contact opening.

6. The method according to claim 1 wherein said first metal layer comprises platinum and wherein said silicide comprises platinum silicide.

7. The method according to claim 1 wherein said first metal layer comprises molybdenum and wherein said silicide comprises molybdenum silicide.

8. The method according to claim 1 wherein said barrier metal layer comprises titanium nitride and is deposited to a thickness of between about 1200 and 1600 Angstroms.

9. The method according to claim 1 wherein said barrier metal layer comprises titanium tungsten and is deposited to a thickness of between about 1200 and 1600 Angstroms.

10. The method according to claim 1 wherein said second metal layer comprises AlCu having a thickness of between about 4000 and 6000 Angstroms.

11. A method of fabricating a Schottky diode in an integrated circuit device comprising:

providing a thermal oxide layer overlying a silicon substrate;

depositing an insulating layer overlying said thermal oxide layer;

etching a contact opening through said insulating layer and said thermal oxide layer to said silicon substrate;

overetching said contact opening for between 45 and 50 seconds after an endpoint etching signal is received whereby a shallow trench is formed within said silicon substrate underlying said contact opening wherein said shallow trench has a bottom and sidewalls comprising said silicon substrate and wherein said shallow trench has a depth of between 300 and 500 Angstroms into said silicon substrate;

thereafter reflowing said insulating layer thereby forming curved sidewalls of said contact opening;

depositing a platinum layer over said insulating layer and within said contact opening and within said shallow trench;

sintering said platinum layer whereby said platinum layer is transformed to a platinum silicide layer where said platinum silicide layer contacts said silicon substrate at said bottom and said sidewalls of said shallow trench and wherein said platinum layer contacting said insulating layer and said thermal oxide layer is not transformed;

removing said platinum layer that is not transformed to a platinum silicide layer;

thereafter removing native oxide on said silicide layer whereby a portion of said thermal oxide layer is removed and wherein contact is not broken between said thermal oxide layer and said platinum silicide layer at said sidewalls of said trench thereby preventing leakage;

thereafter depositing a barrier metal layer overlying said insulating layer and said platinum silicide layer within said shallow trench wherein said barrier metal layer contacts said silicide layer at bottom and sidewall surfaces of said shallow trench; and depositing a second metal layer overlying said barrier metal layer to complete fabrication of said Schottky diode in said integrated circuit device.

12. The method according to claim 11 wherein said thermal oxide layer has a thickness of between about 300 and 400 Angstroms.

13. The method according to claim 11 wherein said insulating layer comprises borophosphosilicate glass having a thickness of between about 8500 and 9000 Angstroms.

14. The method according to claim 11 wherein said step of etching said contact opening comprises a first wet etch to etch between about 4000 and 5000 Angstroms of thickness of said insulating layer followed by a second dry etch to etch the remaining said insulating layer and said thermal oxide layer until said silicon substrate is exposed within said contact opening.

15. The method according to claim 11 wherein said barrier metal layer comprises one of the group containing titanium nitride, titanium tungsten, titanium and titanium nitride, and titanium and titanium tungsten and is deposited to a thickness of between about 1200 and 1600 Angstroms.

16. A method of fabricating a Schottky diode in an integrated circuit device comprising:

providing a thermal oxide layer overlying a silicon substrate;

depositing an insulating layer overlying said thermal oxide layer;

etching a contact opening through said insulating layer and said thermal oxide layer to said silicon substrate wherein said etching comprises a first wet etch to etch through a portion of said insulating layer followed by a second dry etch through a remaining portion of said insulating layer and said thermal oxide layer to expose said silicon substrate;

continuing said dry etch for between 45 and 50 seconds after an endpoint etching signal is received whereby a shallow trench is formed within said silicon substrate underlying said contact opening wherein said shallow trench has a bottom and sidewalls comprising said silicon substrate and wherein said shallow trench has a depth of between 300 and 500 Angstroms into said silicon substrate;

thereafter reflowing said insulating layer thereby forming sloping sidewalls of said contact opening;

depositing a platinum layer over said insulating layer and within said contact opening and within said shallow trench;

sintering said platinum layer whereby said platinum layer is transformed to a platinum silicide layer where said platinum silicide layer contacts said silicon substrate at said bottom and said sidewalls of said shallow trench and wherein said platinum layer contacting said insulating layer and said thermal oxide layer is not transformed;

removing said platinum layer that is not transformed to a platinum silicide layer;

thereafter removing native oxide on said silicide layer whereby a portion of said thermal oxide layer is removed and wherein contact is not broken between said thermal oxide layer and said platinum silicide layer at said sidewalls of said trench thereby preventing leakage;

thereafter depositing a barrier metal layer overlying said insulating layer and said platinum silicide layer within said shallow trench wherein said barrier metal layer contacts said silicide layer at bottom and sidewall surfaces of said shallow trench; and depositing a second metal layer overlying said barrier metal layer to complete fabrication of said Schottky diode in said integrated circuit device.

17. The method according to claim 16 wherein said insulating layer comprises one of the group containing borophosphosilicate glass and borophospho-tetraethoxysilane oxide and wherein said insulating layer has a thickness of between about 8500 and 9000 Angstroms.

18. The method according to claim 16 wherein said barrier metal layer comprises one of the group containing titanium nitride, titanium tungsten, titanium and titanium nitride, and titanium and titanium tungsten and is deposited to a thickness of between about 1200 and 1600 Angstroms.

* * * * *